(12) United States Patent
Aoyama et al.

(10) Patent No.: US 12,376,492 B2
(45) Date of Patent: Jul. 29, 2025

(54) RHENIUM-TUNGSTEN WIRE ROD AND THERMOCOUPLE USING THE SAME

(71) Applicants: KABUSHIKI KAISHA TOSHIBA, Tokyo (JP); TOSHIBA MATERIALS CO., LTD., Yokohama (JP)

(72) Inventors: Hitoshi Aoyama, Yokohama (JP); Hideaki Baba, Yokohama (JP); Kenji Tomokiyo, Yokohama (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 0 days.

(21) Appl. No.: 18/461,864

(22) Filed: Sep. 6, 2023

(65) Prior Publication Data

US 2023/0413672 A1 Dec. 21, 2023

Related U.S. Application Data

(63) Continuation of application No. PCT/JP2022/009116, filed on Mar. 3, 2022.

(30) Foreign Application Priority Data

Mar. 9, 2021 (JP) .................................. 2021-037200

(51) Int. Cl.
*H10N 10/854* (2023.01)
*H01B 1/02* (2006.01)

(52) U.S. Cl.
CPC ............. *H10N 10/854* (2023.02); *H01B 1/02* (2013.01)

(58) Field of Classification Search
CPC ........ H10N 10/854; C22C 27/04; H01B 1/02; G01K 7/02
See application file for complete search history.

(56) References Cited

U.S. PATENT DOCUMENTS

| 3,296,035 | A | * | 1/1967 | Zysk | .................... H10N 10/854 136/227 |
| 2004/0244879 | A1 | * | 12/2004 | Tanaka | ...................... H01J 9/04 148/423 |
| 2011/0319931 | A1 | | 12/2011 | Esaki | |

FOREIGN PATENT DOCUMENTS

| CN | 101350286 | | 1/2009 |
| CN | 102341515 | | 2/2012 |
| CN | 102586663 | | 7/2012 |
| CN | 102586663 | A | 7/2012 |
| CN | 109306420 | | 2/2019 |
| JP | 58-104150 | A | 6/1983 |
| JP | 58104150 | | 6/1983 |
| JP | 2002075059 | | 3/2002 |
| JP | 2002356732 | | 12/2002 |
| JP | 2002356732 | A * | 12/2002 |
| JP | 4256126 | B2 | 4/2009 |

(Continued)

OTHER PUBLICATIONS

English machine translation of JP 2002356732 A (Year: 2024).*

(Continued)

*Primary Examiner* — Angelo Trivisonno
(74) *Attorney, Agent, or Firm* — Oblon, McClelland, Maier & Neustadt, L.L.P.

(57) ABSTRACT

The rhenium tungsten wire rod according to an embodiment is a wire rod made of a tungsten alloy containing rhenium, wherein a rhenium content is less than 30 wt % in any measurement area of a wire rod body where a unit area is 1 µm in diameter.

7 Claims, 5 Drawing Sheets

Inclusions (σ phases) present in ReW matrix and results of semi-quantitative analyses (example of conventional material)

| | Re content (wt%) |
|---|---|
| Analysis 1 | 37.1 |
| Analysis 2 | 27.0 |
| Analysis 3 | 23.5 |
| Analysis 4 | 25.3 |
| Analysis 5 | 27.0 |
| Analysis 6 | 38.7 |

(56) References Cited

FOREIGN PATENT DOCUMENTS

JP            5766833 B2    8/2015
WO    WO 2010/100808 A1    9/2010

OTHER PUBLICATIONS

International Search Report issued Apr. 5, 2022 in PCT/JP2022/009116 filed Mar. 3, 2022 (2 pages).
Monma, Y. et al. "Origin of Drift in PR Thermocouple after Long-time Creep Testing" Tetsu-to-Hagne (Iron and Steel) vol. 75, No. 4, pp. 665-672, 1989 (with English Machine Generated Translation) (23 pages).
Concept Alloys, Inc., "Technical Data Sheet of Tungsten Rhenium Alloys" (2 pages).
Yamari Industries, Limited, "Tungsten Rhenium Thermocouple VAC-Curate 2100" (2 pages).
Ushio, M. "Fundamentals of Thermocouple Thermometry" Journal of the Japan Welding Society, vol. 61, No. 3 pp. 163-167, 1992 (with English Machine Generated Translation) (16 pages).
Office Action mailed on Apr. 23, 2025, in corresponding Chinese Patent Application No. 202280020091.8 (with machine translation).

\* cited by examiner

Schematic diagram of temperature measuring system using thermocouple

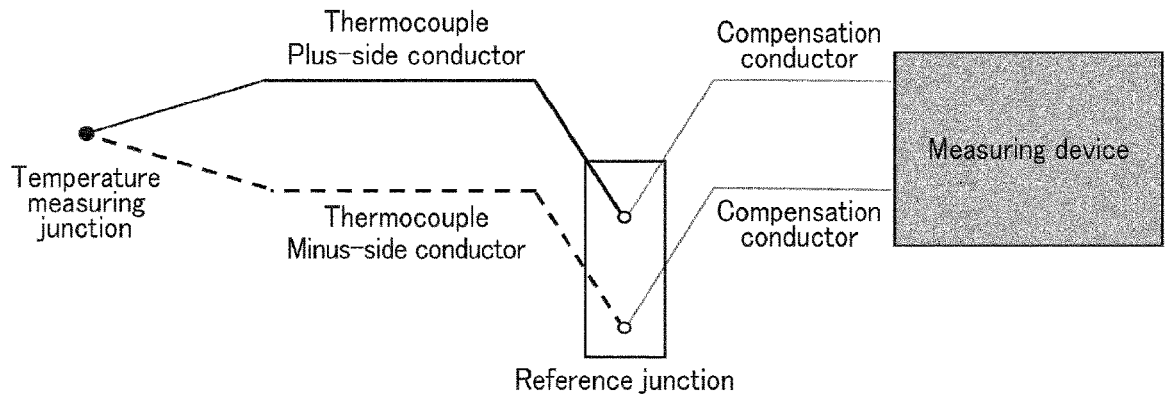

FIG. 1

Type of thermocouple

| Symbol of type | Constituent material | | Temperature range |
|---|---|---|---|
| | Plus-side conductor | Minus-side conductor | Class 2 |
| B | Pt-30%Rh | Pt-6%Rh | 600°C≦, <1700°C |
| R | Pt-13%Rh | Pt | 0°C≦, <1600°C |
| S | Pt-10%Rh | Pt | |
| N | Alloy comprising mainly of Ni, Cr, and Si | Alloy comprising mainly of Ni and Si | -40°C≦, <1200°C |
| K | Alloy comprising mainly of Ni and Cr | Alloy comprising mainly of Ni and Al | |
| E | Alloy comprising mainly of Ni and Cr | Alloy comprising mainly of Cu and Ni | -40°C≦, <900°C |
| J | Fe | Alloy comprising mainly of Cu and Ni | -40°C≦, <750°C |
| T | Cu | Alloy comprising mainly of Cu and Ni | -40°C≦, <350°C |
| C | 5% Re-W alloy | 26% Re-W alloy | 426°C≦, <2315°C |

FIG. 2

Schematic diagram of radial cross-section and surface layer portion of sample
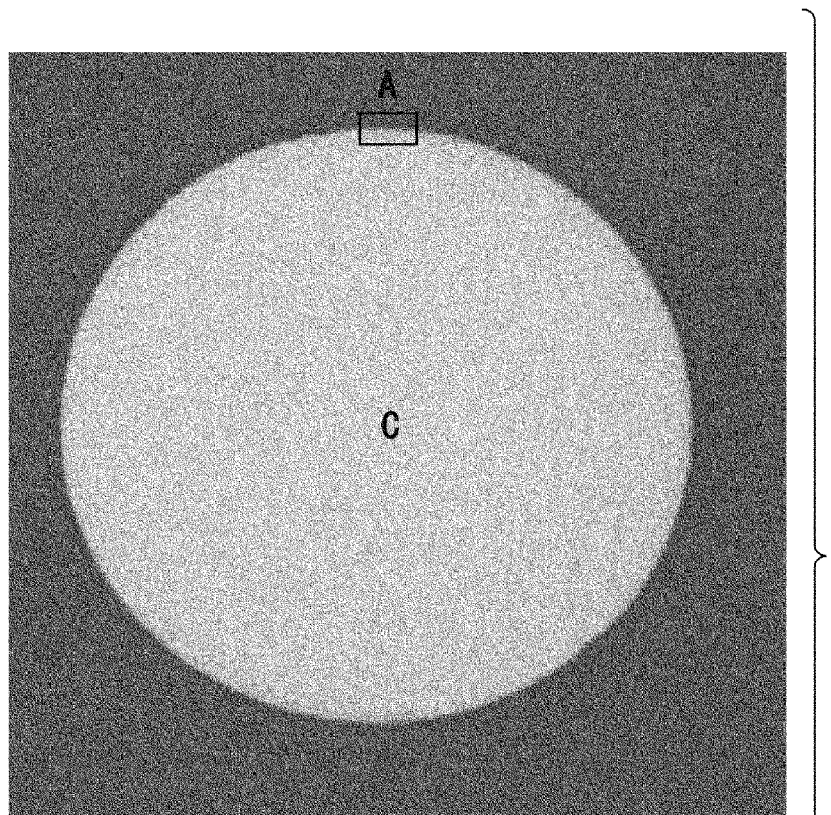
Enlarged view of A
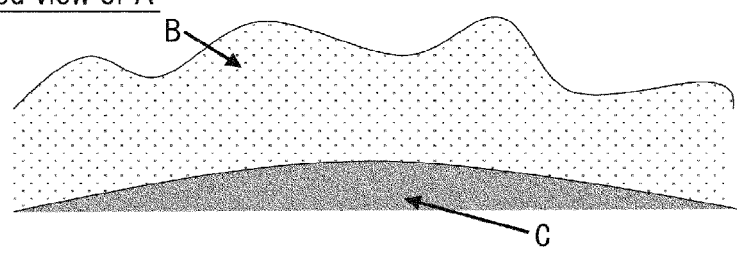
FIG. 4

Schematic diagram of Re content measurement points

Explanatory diagram of particle size distribution

RHENIUM-TUNGSTEN WIRE ROD AND THERMOCOUPLE USING THE SAME

CROSS-REFERENCE TO RELATED APPLICATION

This application is a Continuation Application of PCT Application No. PCT/JP2022/009116, filed Mar. 3, 2022 and based upon and claiming the benefit of priority from Japanese Patent Application No. 2021-037200, filed Mar. 9, 2021, the entire contents of all of which are incorporated herein by reference.

FIELD

Embodiments described below relate to a rhenium-tungsten wire rod and a thermocouple using the same.

BACKGROUND

Conventionally, various tungsten (W) wires have been used for cathode heaters of electron guns for TVs, filament materials for illumination of automobile lamps and household electric appliances, high-temperature structural members, contact materials, and constituent materials of discharge electrodes. Among them, a tungsten alloy (Re-W) wire containing a predetermined amount of rhenium (Re) is widely used for probe pins for semiconductor inspection due to its improved electric resistance properties and wear resistance as compared with W wires themselves. It is also widely used for heaters for electron tubes, filament materials for vibration-resistant bulbs, thermocouples, and the like due to its improved high-temperature strength and ductility after recrystallization as compared with W wires themselves. It is also used for medical needles since it has higher strength and rigidity at room temperature than stainless steel wires and W wires due to solid solution strengthening of Re. (Patent Literature 2 (Japanese Patent No. 5766833)).

FIG. 1 schematically shows an example of temperature measurement using a thermocouple. A thermocouple is a temperature sensor which combines two dissimilar metals and utilizes the thermoelectromotive force of these metals, and has been most widely used in the industry for many years because of its characteristics such as its simple structure and its adoptability in a wide temperature range from a low temperature region to a high temperature region in selecting a material. FIG. 2 shows some of the types of thermocouples according to JIS standards (see JIS C1602) as an example. B, S, and R thermocouples made of a platinum-rhodium alloy and a C thermocouple made of Re-W are used at high temperatures. Particularly, in a non-oxidizing atmosphere of about 1500° C. or higher, the C thermocouple is often used.

For example, to produce sintered metals or sintered ceramics, a mixture of a base powder and a wax as a binder is formed into a molded product, which is then subjected to heat treatment in a vacuum atmosphere at a temperature of 1000° C. or lower to remove the wax. Subsequently, heat treatment at 1600 to 2000° C. is performed to carry out sintering, during which the C thermocouple is used for the measurement of the temperature of 1600 to 2000° C. For example, in a pressure sintering (HP) furnace and a hot isostatic pressing (HIP) apparatus, the temperature inside a pressure vessel is as high as about 2000° C. in a pressurized gas atmosphere. Optical temperature measurement using a radiation thermometer and the like makes it necessary to provide openings for directly observing radiation light of a furnace chamber, causing a decrease in the strength of the pressure vessel. Openings in the vessel also cause heat loss. This makes the application very difficult and the apparatus expensive. Thus, the C thermocouple is used for temperature measurement in an HP furnace or an HIP apparatus to which the High Pressure Gas Safety Act is applied.

In recent years, ceramics having high performance such as silicon nitride have been increasingly used for, for example, insulative heat dissipation substrates for power semiconductor modules and LED mounting, bearing balls for wind power generators and in-vehicle engines, and industrial equipment components such as in-vehicle components and semiconductor manufacturing devices. These ceramics are produced using the aforementioned heat treatment apparatus, and it is very important to control the temperature profile of the heat treatment in order to produce the ceramics at a high yield while maintaining high performance of the ceramics. Therefore, it is very important to maintain the accuracy of the temperature measurement within a manufacturing lot or between manufacturing lots of thermocouples.

When using a thermocouple, it is necessary to perform calibration to determine the relationship between a value indicated by the thermocouple and an actual temperature. There are roughly two types of calibration methods, a fixed-point method and a comparative method. The fixed-point method is a method in which calibration is performed by giving an accurate temperature value at a fixed temperature point. The comparative method is a method in which calibration is performed by measuring a discretionarily set temperature of a thermostatic chamber with a standard thermocouple (reference wire) and obtaining an error between the standard thermocouple and a thermocouple to be calibrated that simultaneously performed the measurement. In general, the C thermocouple adopts the comparative method since it measures a temperature of 1500° C. or higher.

It is considered that thermocouples used at high temperatures do not change the relationship between a temperature and a thermoelectromotive force as long as there is no inhomogeneity in any parts of the wires constituting the thermocouples. The inhomogeneity herein means "a change in a thermoelectromotive force per temperature difference of 1° C." (see Non-Patent Literature 1 (Yoshio Monma and five others "Origin of Drift in PR Thermocouple after Long-time Creep Testing", Iron and Steel 1989, 75, No. 4, pp. 665-672)). That is, if a portion having this inhomogeneity (i.e., an inhomogeneous portion) exists in a wire and a temperature gradient is generated in this portion, a detected thermoelectromotive force shows a value differing from that of a thermocouple with a wire having no inhomogeneous portion. For example, even if the above-described calibration is performed, there is a high probability that a heat gradient in an actual apparatus cannot be reproduced, and an error is likely to occur in the post-calibration temperature. Also, if there are inhomogeneous portions in many parts of the wire, the difference from the reference wire will be excessively large, likely resulting in a product that cannot be calibrated.

On the other hand, a medical needle is shaped by cutting a wire into a desired length and pressing or bending it. Since stress is applied to the cut wire during pressing or bending, it is required that the wire be not easily cracked and that the bent portion of the wire be not broken. Medical needles are also used for suturing during surgery. In order to suppress variability of the behavior of the needles, such as deflection of the needles caused by the force applied during suturing, it is preferable that the tensile strength be high and the variation be small. In order to prevent a decrease in the yield due to cracking or breakage during processing of the needles and to obtain needles with a stable quality, it is necessary that the cut wires be homogeneous, that is, that the wires to be used be homogeneous.

A main factor of the inhomogeneity is variation in material quality of the wires. For example, Re-W is usually produced by a powder metallurgy method in which a W powder and a Re powder are mixed, and a resultant mixture is molded and sintered. Since sintering of Re-W proceeds due to solid-phase diffusion, it can become impossible to diffuse and homogenize Re in the W matrix (to make a solid solution), depending on the particle size distribution of the powders, the mixing state of the powders, and the molding and sintering conditions. As a result, a phase region in which the Re composition ratio is locally high (i.e., a segregated phase of a σ phase) may be generated. Generation of a segregated phase of a σ phase means that there is also a part where the Re composition ratio is lower than an average. If a sintered body having such variation in the Re composition is processed into a rod material or a wire (wire rod), inhomogeneity due to the variation (fluctuation) in the amount of Re occurs in a cross-section in the processing direction (i.e., an axial cross-section) or a cross-section perpendicular to the axial direction (i.e., a radial cross-section). If the segregated phase of the σ phase described above is unevenly distributed in a certain part, for example, breaking of a wire is likely to occur during drawing processing. To address this issue, there is a Re-W wire in which the segregated phase of the σ phase has a maximum particle size of 10 μm or less and is dispersed in a wide range (see Patent Literature 1 (Japanese Patent No. 4256126)).

BRIEF DESCRIPTION OF THE DRAWINGS

FIG. 1 is a schematic diagram of a temperature measuring system using a thermocouple.

FIG. 2 is a table showing the types of thermocouples.

FIG. 4 is a schematic diagram of a radial cross-section and a surface layer portion of a sample.

DETAILED DESCRIPTION

The method described in Patent Literature 1 (Japanese Patent No. 4256126) aims to suppress the presence of a segregated phase of a σ phase to a level where no breaking of a wire occurs during drawing by refining the region where the segregated phase of the σ phase is present to a predetermined size or smaller and dispersing the segregated phase of the σ phase in a wide range instead of the state in which the segregated phase of the σ phase is unevenly distributed in a specific region, and allows the presence of a fine segregated phase of a σ phase. However, even if the segregated phase of the σ phase is homogeneously present, a change in the abundance ratio in a certain volume will likely cause variation in the amount of Re (a change in the material quality) in an axial cross-section or a radial cross-section and generate an inhomogeneous portion.

Figure 3:
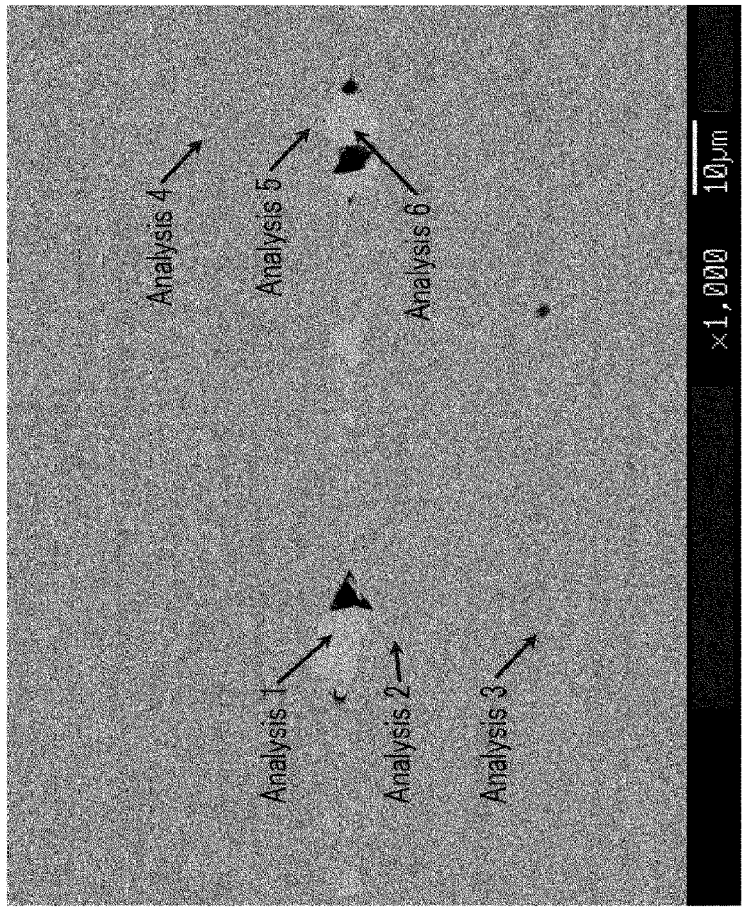
FIG. 3 is a diagram showing inclusions (σ phases) present in a ReW matrix and results of semi-quantitative analyses (an example of a conventional material).

FIG. 3 shows, as an example, the amount of Re in a W matrix in the case where a segregated phase of a σ phase is present in a 26% Re-W wire. The results of semi-quantitative analyses according to EPMA (acceleration voltage: 15.0 kV, irradiation current: $5.0 \times E^{-8}$ A, beam diameter: 1 μm or less) also demonstrate that the σ phase is an inclusion. Since the σ phase is harder than the matrix, it is present in the form of an inclusion in this manner. The amount of Re in the matrix varies in the vicinity of the σ phase. As described herein, the presence of the σ phase causes variation (inhomogeneity) in the amount of Re in the surrounding portion of the σ phase.

To solve the above problem, a rhenium-tungsten wire rod according to an embodiment is a wire rod made of a tungsten alloy containing rhenium, wherein the rhenium content is less than 30 wt % in any measurement area of the wire rod body where the unit area is 1 μm in diameter.

A rhenium-tungsten wire rod of an embodiment will be described below with reference to the drawings. Hereinafter, the rhenium-tungsten wire rod may be referred to as a ReW wire rod. The drawings are schematic, and a ratio of dimensions of each part and the like are not limited to those shown in the drawings.

FIG. 4 shows an example of a radial cross-section of a sample taken from a ReW wire rod. In the radial cross-section, the body of the rhenium-tungsten wire rod is indicated by C. FIG. 4 also shows an enlarged view of a portion, indicated by A, of the outer periphery of the rhenium-tungsten wire rod in the radial cross-section. As shown in the enlarged view of FIG. 4, a surface mixture layer B is formed on the outer periphery of the rhenium-tungsten wire rod body C. The surface mixture layer B contains W, O, and C as constituent elements. The diameter of the wire rod is preferably 0.1 mm to 5.0 mm so that the wire rod can be used for various thermocouples or used as a wire for drawing processing. In the case of using the wire rod for thermocouples, for example, the wire diameter being less than 0.1 mm is likely to cause wire breakage due to evaporation consumption during use at a high temperature, resulting in short life. If the wire diameter is more than 5.0 mm, the temperature of an object cannot be accurately measured due to the heat capacity of the thermocouples themselves. A more preferred range of the wire diameter is from 0.2 mm to 3.5 mm. The ReW wire rod is processed into a diameter of 0.1 mm to 5.0 mm through a swaging (SW) step and a subsequent drawing (DW) step. The wire rod after SW or DW has a mixture layer on its surface. The mixture contains W, O, and C as constituent elements, and is removed through, for example, an electrolytic process when the wire rod is commercialized. The body part excluding this mixture is used as a sample. Although the sampling position is discretionary, it is desirable to sample two or more positions apart from each other within a single wire rod in consideration of the yield of the product and in order to evaluate variation. Within a single ReW wire rod, the front and rear ends have a portion where the conditions become unstable, for example, at the time when a DW apparatus is started and stopped. This portion is not included in the sampling. The length of the unstable portion varies depending on the layout and size of the apparatus.

Figure 5:
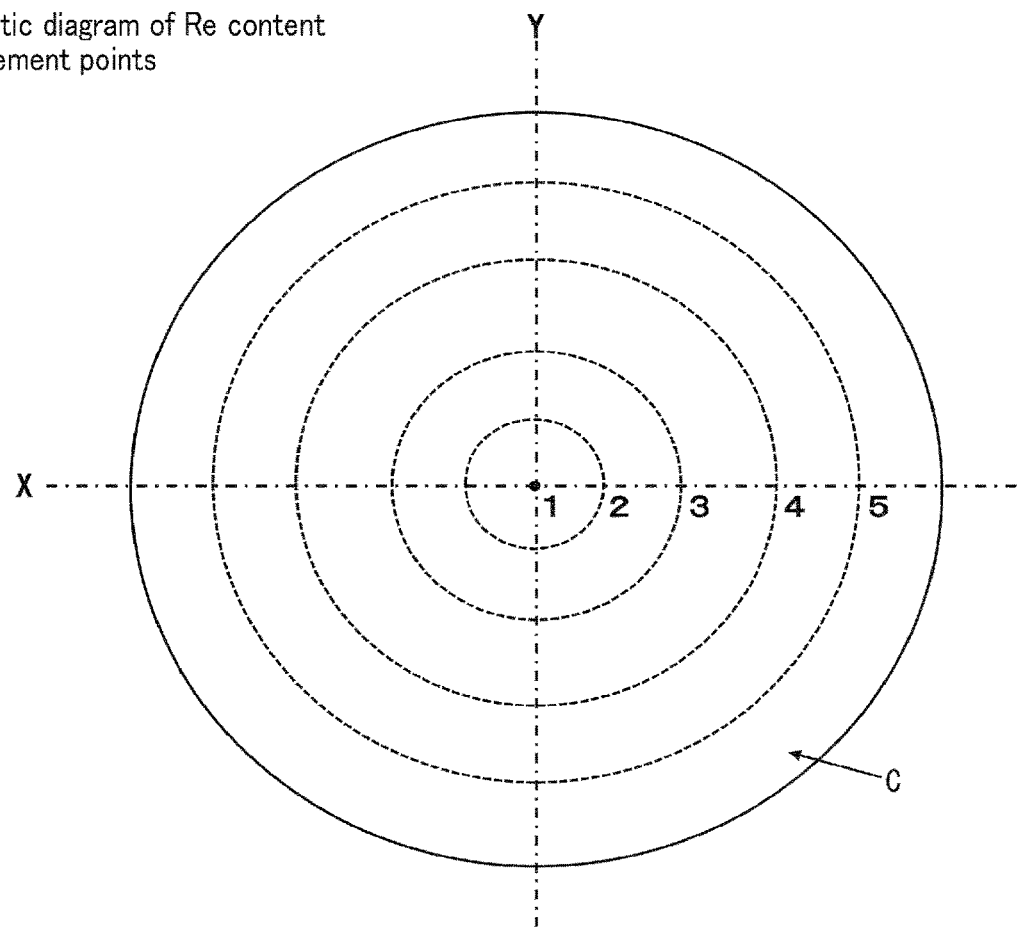
FIG. 5 is a schematic diagram of Re-content measurement points.

The measurement may be performed on any cross-section of a sample, but preferably is performed on a radial cross-section of a sample, as shown in FIG. 4, from the viewpoint of the ease of processing the sample. Embedding a sample in a resin, and polishing and etching it as necessary makes it easy to observe the sample. For the obtained measurement surface, the amount of Re in a region having a diameter of 1 μm is quantified using an electron probe microanalyzer (EPMA) at a total of 17 points, which are intersections (16 points) of four equally spaced concentric circles 2 to 5 with the X-axis and the Y-axis and a center 1, in the radial cross-section of the rhenium-tungsten wire rod body C, as shown in FIG. 5, for example. The measurement position described is an example, and the measurement may be performed at any position; However, the above-described position is preferred in order to measure the entire cross-section evenly. In addition, the radial cross-section to be measured is not a single section of the wire rod discretionarily selected but two or more discretionarily selected sections of the wire rod apart from each other.

In any measurement area of the ReW wire rod body of the embodiment, where the unit area is 1 μm in diameter, the content of rhenium is less than 30 wt %. A Re content of 30 wt % or more exceeds an average adding amount. This indicates that Re or W is not sufficiently diffused in the sintering step and that the Re content varies in the axial cross-sectional direction and the radial cross-sectional direction. The variation in the Re content is a cause of inhomogeneity, and may cause the thermoelectromotive force to vary between positions in the ReW wire rod.

Next, an average value (Ave), a standard deviation (Sd), and a coefficient of variation (CV) calculated according to Sd/Ave are obtained for the data of the amount of Re obtained. The CV indicates a ratio of the magnitude of variation in data to the average, allowing comparison of the variation regardless of whether the Re ratio of the ReW wire rod is high or low.

The CV of the rhenium content in the ReW wire rod of the embodiment is preferably 0.10 or less. It is more preferably 0.05 or less. The CV being larger than 0.10 indicates, for example, that there is variation in the Re content in the axial cross-sectional direction or the radial cross-sectional direction even if there is no segregated phase of the σ phase. The variation in the Re content is a cause of inhomogeneity, and may cause the thermoelectromotive force to vary between positions in the ReW wire rod.

The amount of Re contained in the ReW wire rod of the embodiment is preferably 1 wt % or more and less than 30 wt %, and more preferably 2 wt % to 28 wt %. The amount of Re is a value obtained by performing analysis according to inductively coupled plasma optical emission spectrometry (ICP-OES) suitable for evaluation of constituent elements, not according to inductively coupled plasma mass spectrometry (ICP-MS) suitable for evaluation of trace impurities. Re improves the elongation of W at high temperatures and enhances the workability. The strength is also increased by solid solution strengthening. However, if the content is less than 1 wt %, the effects are insufficient. For example, if the ReW wire rod is used as a material for a probe pin, the amount of deformation of the completed probe pin increases with the frequency of use and failure in contact occurs, degrading the inspection accuracy of a semiconductor. If the Re content is more than about 28 wt %, it exceeds the limit of solid solubility with W, thus generating a segregated phase of a σ phase and likely generating an inhomogeneous portion in the wire rod. The generation of an inhomogeneous portion causes variation in thermoelectromotive force and strength. By setting the amount of Re to 1 wt % or more and less than 30 wt % or setting the amount of Re to 2 wt % to 28 wt %, it is possible to manufacture, with high yield, thermocouples including a plus-side conductor and a minus-side conductor (the plus-side conductor referring to a positive side conductor and the minus-side conductor referring to a negative side conductor) that include the embodiment for the constituting material and ReW wires for probe pins including the embodiment for the constituting material while securing thermoelectromotive force properties (stability) and mechanical properties (strength and wear resistance).

The ReW wire rod of the embodiment may contain 30 wtppm to 90 wtppm of K as a dopant. Containing K improves tensile strength and creep strength at high temperatures due to the doping effects. If the K content is smaller than 30 wtppm, the doping effects become insufficient. If the K content exceeds 90 wtppm, the workability is decreased, likely causing a large decrease in the yield. By containing K as a dopant in a range of 30 wtppm to 90 wtppm, it is possible to manufacture, with high yield, thermocouples including a plus-side conductor and a minus-side conductor each including the embodiment for the constituting material and ReW wires for electronic tube heaters including the embodiment for the constituting material while securing high-temperature properties (prevention of wire breakage and deformation during high-temperature use).

The ReW wire rod of the embodiment can have a tensile strength standard deviation of 35 N/mm² or less. Since the processing stability of the ReW wire rod can be improved by suppressing variation in tensile strength, an improved yield of products (such as thermocouples, probe pins, and medical needles) which include the ReW wire rod can be expected. Also, if the ReW wire rod is used as a material of medical needles due to its stable tensile strength, the quality of the medical needles is improved. If the ReW wire rod of the embodiment has a tensile strength standard deviation of 35 N/mm² or less and a wire rod diameter of 0.1 mm to 5.0 mm, it can achieve more excellent processing stability.

Tensile strength is measured using a universal tension and compression tester. The load varies depending on the wire diameter; thus, for the universal tension and compression tester, the load cell may be replaced or different devices may be used according to the wire diameter. For example, AG-I 5 kN manufactured by SHIMADZU or LTS 500N manufactured by Minebea Inc. may be used. A test piece is chucked by a flat plate via non-slip sandpaper, and both ends thereof are fixed to the device. Setting the gage length to 50 mm, the tensile test is conducted at a rate of 10 mm/min. If there is no broken portion between the gage marks, measurement is performed again.

According to the embodiment described above, it is possible to realize a ReW wire rod which has no variation in the material quality (i.e., no inhomogeneous portion) and greatly contributes to improvement of the stability of the thermoelectromotive force, and the ReW wire rod can be applied to thermocouples for high-temperature use. The ReW wire rod can also be applied to probe pins. The ReW wire rod is not limited to having a circular cross-section, and may have a cross-section having a shape other than a circular shape, such as an elliptical shape or a polygonal shape.

Next, a method of manufacturing the ReW wire rod according to the embodiment will be described. The manufacturing method is not particularly limited, and examples thereof include the following.

A W powder and a Re powder are mixed so that the Re content will be 1 wt % or more and less than 30 wt %. The mixing method is not particularly limited; however, forming powders into slurry using water or an alcohol solution and mixing them is particularly preferred since powders with good dispersibility can be obtained. Also, in order to ensure the homogeneity of the powder lots, it is more preferable to dry the slurry and then collectively stir the same powder lots in a dry state.

Figure 6:
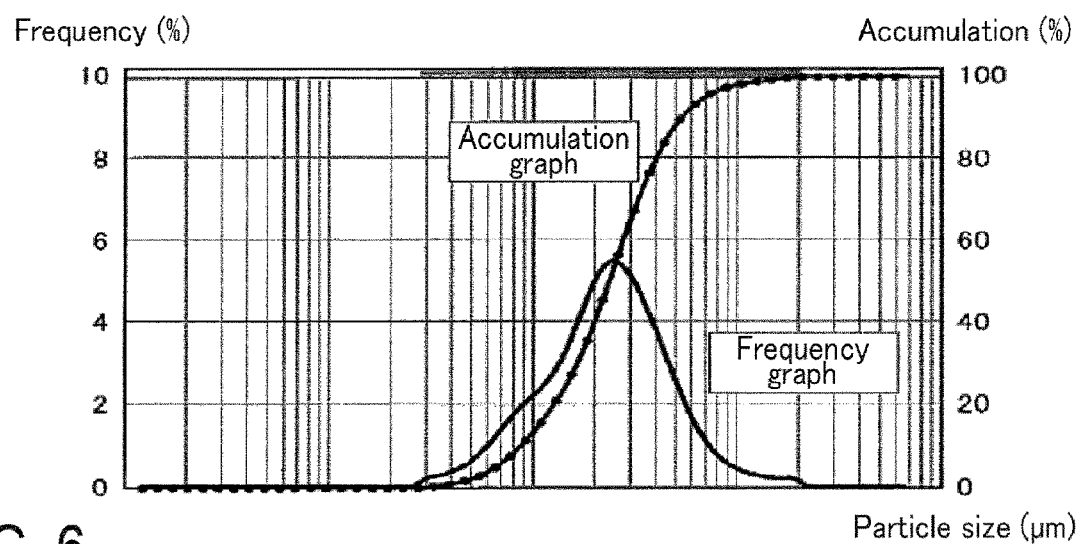
FIG. 6 is an explanatory diagram of a particle size distribution.

The Re powder to be mixed preferably has an average particle size of less than 8 μm. The particle size distribution preferably has an SD value of less than 11 μm. FIG. 6 is an explanatory diagram of the particle size distribution. The horizontal axis represents particle size (μm), the left vertical axis represents frequency (%), and the right vertical axis represents accumulation (%). The SD value is a value determined by
SD=(d (84%)−d (16%))/2, where d (84%) is a particle size at 84% accumulation and d (16%) is a particle size at 16% accumulation, and serves as a measure of the distribution width of the measured particle sizes. The particle size distribution is measured by a laser diffraction method. The amount of powder used for single measurement is the amount recommended for the measuring device. In general, 0.02 g is recommended. The measurement sample is sufficiently stirred before measurement and then weighed.

The W powder is a pure W powder excluding inevitable impurities or a doped W powder containing K in an amount that takes into consideration the yield up to the wire material. The W powder preferably has an average particle size of less than 16 μm. The particle size distribution preferably has an SD value of less than 13 μm. If the average particle size and the particle size distribution of each of the Re powder and the W powder are equal to or more than the above numerical values, the diffusion distance of the Re atoms or W atoms for obtaining homogeneity increases, facilitating generation of a σ phase.

A ratio of the Re average particle size to the W average particle size is preferably 0.4 to 2.0. If the ratio of the Re average particle size to the W average particle size is smaller than 0.4 or larger than 2.0, the diffusion distance of the Re atoms to the center of the W particles or the diffusion distance of the W atoms to the center of the Re particles becomes large, likely facilitating generation of a σ phase.

Next, the mixed powder is put into a predetermined mold and press-molded. The pressing force at this time is preferably 150 MPa or more. The molded body may be subjected to presintering at 1200 to 1400° C. in a hydrogen furnace for the sake of easy handling. The molded body obtained is sintered in a hydrogen atmosphere, an inert gas atmosphere such as argon, or a vacuum. The sintering temperature is preferably 2500° C. or higher. If the temperature is lower than 2500° C., diffusion of the Re atoms and the W atoms does not proceed sufficiently during sintering. The upper limit of the sintering temperature is 3400° C. (the melting point of W is 3422° C. or less).

The relative density of the sintered body is preferably 90% or more. The relative density after sintering is a relative density (%) with respect to the true density, and the relative density (%) with respect to the true density is represented by [sintered body density/true density]×100%. For example, in a single sintered body, a ratio of the density of the lowest portion such as the lower end during electric sintering to the average density of the entire sintered body is preferably 0.98 or more. The variation in the Re content can be suppressed by setting the relative density of the sintered body to 90% or more and the ratio of the density of the lowest portion to the average density of the entire sintered body to 0.98 or more.

First SW processing is performed on the sintered body obtained in the main sintering step. The first SW processing is preferably performed at a heating temperature of 1300 to 1600° C. The reduction rate of the cross-sectional area (area reduction rate) at which processing is performed by single heat treatment (single heating) is preferably 5 to 15%.

Instead of the first SW processing, rolling processing may be performed. The rolling processing is preferably performed at a heating temperature of 1200 to 1600° C. The area reduction rate in single heating is preferably 40 to 75%. A two-way roller rolling mill, a four-way roller rolling mill, a die roll rolling mill, or the like can be used as a rolling mill. The rolling processing can greatly enhance the production efficiency. The first SW processing and the rolling processing may be combined.

Second SW processing is performed on the sintered body (ReW rod) which has been subjected to the first SW processing, the rolling processing, or the combined processing. The second SW processing is preferably performed at a heating temperature of 1200 to 1500° C. The area reduction rate in single heating is preferably about 5 to 20%.

The ReW rod which has been subjected to the second SW step is then subjected to recrystallization treatment. The recrystallization treatment can be performed at a treatment temperature of 1800 to 2600° C. and using, for example, a high-frequency heating apparatus in a hydrogen atmosphere, an inert gas atmosphere such as argon, or a vacuum.

The ReW rod which has been subjected to the recrystallization treatment is then subjected to third SW processing. The third SW processing is preferably performed at a heating temperature of 1200 to 1500° C. The area reduction rate in single heating is preferably about 10 to 30%. The third SW processing is performed until the ReW rod has a diameter at which drawing processing can be performed (preferably a diameter of 2 to 4 mm).

In order to enable drawing (DW) processing to be performed smoothly, the ReW rod which has been subjected to the third SW processing is then subjected to DW processing in which a process of applying a lubricant to the surface, a process of drying the lubricant and performing heating at a temperature that allows the processing to be performed, and a process of drawing using a drawing die are repeated. It is desirable to use a C-based lubricant excellent in heat resistance as the lubricant. The processing temperature is preferably 1100° C. or less. The processing temperature is set accordance to the wire diameter to be obtained by DW. The area reduction rate per die is preferably 10 to 35%. If necessary, an annealing step or a surface polishing step (e.g., an electrolytic step) may be added during the DW step.

Necessary steps such as heat treatment and surface polishing are additionally performed on an appropriate amount of ReW wire rod after SW or DW, so that the resultant can be used as a material for thermocouples. Thereafter, thermocouples are manufactured with predetermined combinations of materials.

EXAMPLES

In Examples 1 to 4, sintered bodies were produced under the processing conditions described above. In Example 5 and Comparative Example 1, sintered bodies were produced under the conventional sizes of a Re powder and a W powder. In Example 6 and Comparative Example 2, sintered bodies were produced under the conventional condition of the size of a W powder. Table 1 shows the analytical results of each example. The analysis of Re and K was performed not by inductively coupled plasma mass spectrometry (ICP-MS) but by inductively coupled plasma optical emission spectrometry (ICP-OES). The lower detection limit of K is 5 wtppm, and the case where the analytical value was lower than 5 wtppm because K was not added is indicated by "−".

TABLE 1

|  | Re (wt %) | K (wtppm) | Re Powder Average Diameter (μm) | Re Powder SD Value (μm) | W Powder Average Diameter (μm) | W Powder SD Value (μm) | Re Average Diameter/ W Average Diameter | Relative Density (%) | Density Ratio |
|---|---|---|---|---|---|---|---|---|---|
| Example 1 | 3 | 60 | 5.7 | 7.4 | 14.2 | 9.0 | 0.40 | 92 | 0.98 |
| Example 2 | 5 | 60 | 5.7 | 7.4 | 14.2 | 9.0 | 0.40 | 92 | 0.98 |
| Example 3 | 5 | 60 | 5.7 | 7.4 | 3.2 | 6.3 | 1.78 | 92 | 0.98 |
| Example 4 | 26 | — | 5.7 | 7.4 | 3.2 | 6.3 | 1.78 | 97 | 0.99 |
| Example 5 | 3 | 60 | 11.0 | 13.0 | 35.0 | 13.2 | 0.31 | 90 | 0.95 |
| Example 6 | 5 | 60 | 5.7 | 7.4 | 35.0 | 13.2 | 0.16 | 91 | 0.95 |
| Comparative Example 1 | 5 | 60 | 11.0 | 13.0 | 35.0 | 13.2 | 0.31 | 88 | 0.94 |
| Comparative Example 2 | 26 | — | 5.7 | 7.4 | 17.0 | 11.0 | 0.34 | 89 | 0.96 |

Each of the sintered bodies was processed to have a diameter of 0.5 mm in the above-described processing steps. The sintered bodies of Examples 2 and 4 and Comparative Example 2 were separately processed to have a diameter of 5.0 mm and to a diameter of 0.1 mm. After completion of processing, samples were taken from both ends of each wire rod by the above-described method. At 34 points (17 points×2 samples) in total per size, the Re content in a 1 μm-diameter region was analyzed using EPMA (JXA-8100 manufactured by JEOL Ltd., magnification: 1000 times, acceleration voltage: 15.0 kV, irradiation current: 5.0×E⁻sA). The CV was then calculated from the analytical values. Table 2 shows the results of evaluation. The Re content is indicated by "○" when the content is "less than 30 wt % at all measurement points", and indicated by "×" when the content is "30 wt % or more at one or more points". The diagonal lines in the table indicate the sizes for which no samples were made. Also, the case where the analytical value was lower than 5 wtppm because K was not added is indicated by "–".

indicates a combination of the front of one of the wire rods and the front of the other of the wire rods. For each prototype, the thermocouple was put into an electric furnace together with a calibrated platinum-rhodium thermocouple, and thermoelectromotive force was measured by the system shown in FIG. 1 at the temperature of 1600° C. by the platinum-rhodium thermocouple to calculate a temperature (JISC1602). The temperature measurement system shown in FIG. 1 includes a positive "+" side conductor and a negative "–" side conductor of a thermocouple, a temperature measuring junction, a reference junction, a measuring device, and a compensation conductor. The temperature measuring junction is formed by welding a distal end of the positive side conductor of the thermocouple and a distal end of the negative side conductor of the thermocouple. The positive side conductor of the thermocouple and the negative side conductor of the thermocouple are each connected to the reference junction. The reference junction and the measur-

TABLE 2

|  | Re (wt %) | K (wtppm) | Diameter 0.1 mm Re Content | Diameter 0.1 mm CV | Diameter 0.5 mm Re Content | Diameter 0.5 mm CV | Diameter 5 mm Re Content | Diameter 5 mm CV |
|---|---|---|---|---|---|---|---|---|
| Example 1 | 3 | 60 |  |  | ○ | 0.05 |  |  |
| Example 2 | 5 | 60 | ○ | 0.05 | ○ | 0.05 | ○ | 0.05 |
| Example 3 | 5 | — |  |  | ○ | 0.02 |  |  |
| Example 4 | 26 | — | ○ | 0.02 | ○ | 0.02 | ○ | 0.02 |
| Example 5 | 3 | 60 |  |  | ○ | 0.15 |  |  |
| Example 6 | 5 | 60 |  |  | ○ | 0.13 |  |  |
| Comparative Example 1 | 5 | 60 | × | 0.15 | × | 0.15 | × | 0.15 |
| Comparative Example 2 | 26 | — | × | 0.13 | × | 0.13 | × | 0.13 |

Next, using the wire rods that have been processed to have a diameter of 0.5 mm, prototypes of thermocouples were made through predetermined processes, with the combinations of the wire rods of prototypes 1 to 8 shown in Table 3. Relating to prototype 2, a prototype having a diameter of 0.1 mm (prototype 2-2) and a prototype having a diameter of 5 mm (prototype 2-3) were also made. As the materials of each prototype, two wire rods were sampled from both ends of the wire rods. Four thermocouples made of respective combinations were produced so that the combinations of the positions did not overlap each other (i.e., so that the combinations were front-front, front-rear, rear-front, rear-rear). Herein, one end of a wire rod is the front and the other end of the same wire rod is the rear. For example, "front-front"

ing device are connected by the compensation conductor. Table 3 shows the difference between the maximum temperature and the minimum temperature (Max–Min) obtained by using each prototype. As is apparent from the table, in the ReW wire rod according to the embodiment, the variation in Re of the ReW wire rod body was suppressed, and the variation in temperature of the thermocouple including the same wire rod was suppressed. In contrast, in the comparative examples, the variation in Re was not suppressed, and the variation in temperature of the thermocouples using the same wire rods was large. Thus, the yield of thermocouples is greatly improved if the embodiment is employed.

TABLE 3

| | Re (wt %) | K (wtppm) | Re Content | CV | Combination in Thermocouple | | | | | |
|---|---|---|---|---|---|---|---|---|---|---|
| | | | | | Prototype 1 | Prototype 2 | Prototype 3 | Prototype 4 | Prototype 5 | Prototype 6 |
| Example 1 | 3 | 60 | ○ | 0.05 | ● | | | | | |
| Example 2 | 5 | 60 | ○ | 0.05 | | ● | | | | |
| Example 3 | 5 | — | ○ | 0.02 | | | ● | | | |
| Example 4 | 26 | — | ○ | 0.02 | ● | ● | ● | | | |
| Example 5 | 3 | 60 | ○ | 0.15 | | | | | ● | |
| Example 6 | 5 | 60 | ○ | 0.13 | | | | | | ● |
| Comparative Example 1 | 5 | 60 | X | 0.15 | | | | ● | | |
| Comparative Example 2 | 26 | — | X | 0.13 | | | | ● | ● | ● |
| Max-Min (° C.) | | | | | 1 | 1 | 1 | 32 | 22 | 25 |

| | Re (wt %) | K (wtppm) | Re Content | CV | Combination in Thermocouple | | | | |
|---|---|---|---|---|---|---|---|---|---|
| | | | | | Prototype 7 | Prototype 8 | Prototype 9 | Prototype 2-2 | Prototype 2-3 |
| Example 1 | 3 | 60 | ○ | 0.05 | | | | | |
| Example 2 | 5 | 60 | ○ | 0.05 | ● | | | ● | ● |
| Example 3 | 5 | — | ○ | 0.02 | | | | | |
| Example 4 | 26 | — | ○ | 0.02 | | ● | ● | ● | ● |
| Example 5 | 3 | 60 | ○ | 0.15 | | ● | ● | | |
| Example 6 | 5 | 60 | ○ | 0.13 | ● | | | | |
| Comparative Example 1 | 5 | 60 | X | 0.15 | | | | | |
| Comparative Example 2 | 26 | — | X | 0.13 | ● | | | | |
| Max-Min (° C.) | | | | | 15 | 15 | 11 | 1 | 1 |

Figure 7:
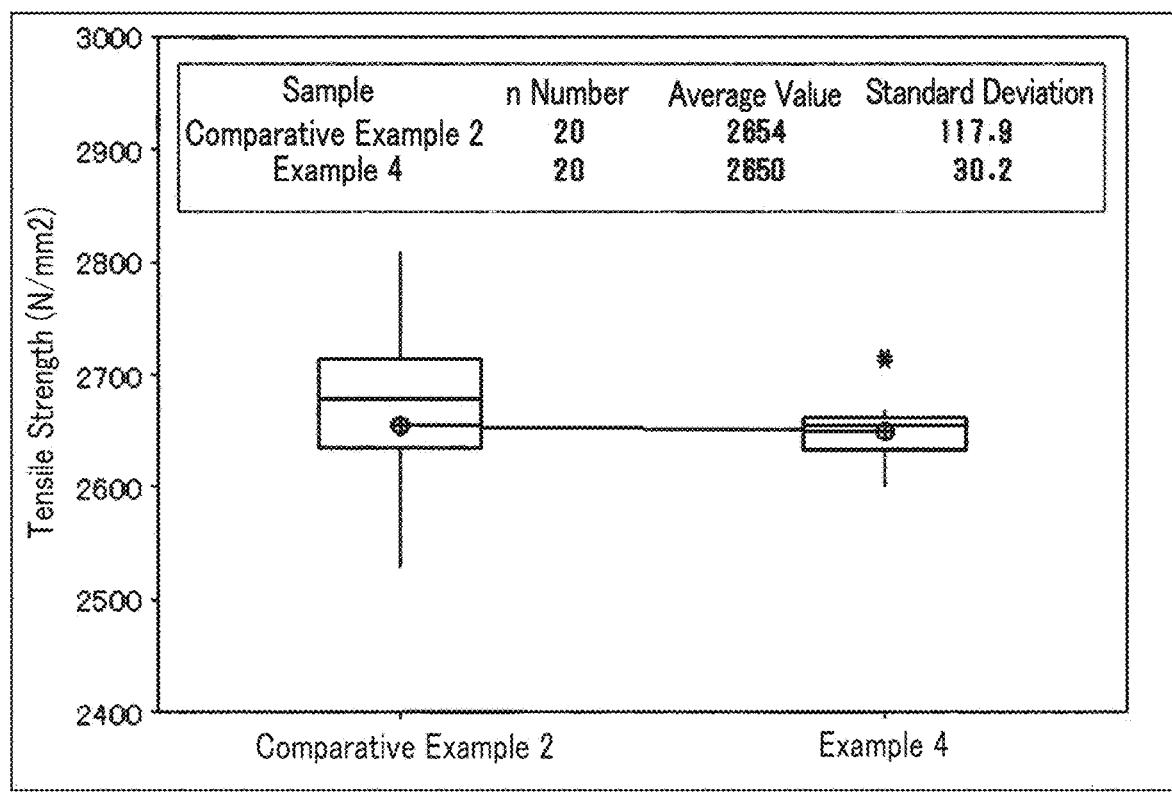
FIG. 7 shows a comparison of tensile strength between Example 4 and Comparative Example 2.

In addition, the tensile strength was compared between Example 4 having a diameter of 0.5 mm and Comparative Example 2 having a diameter of 0.5 mm. For the tensile piece, twenty samples were taken evenly from the entire length. A universal tension and compression tester (AG-I 5 kN manufactured by SHIMADZU) was used to conduct the test. The test piece was chucked by a flat plate via non-slip sandpaper, and both ends thereof were fixed to the device. Setting the gage length to 50 mm, the tensile test was conducted at a rate of 10 mm/min. FIG. 7 shows the results of the test. Although there is no difference in the average value of the tensile strength between Example 4 and Comparative Example 2, the standard deviation indicating variation is very small in Example 4 as compared with Comparative Example 2. Therefore, the stability of conditions when the example is processed as a material is greatly improved, which contributes to improvement of the yield. In the other examples as well, the standard deviation of the tensile strength was 35 N/mm² or less.

The stability of conditions when the example is processed as a material is greatly improved, which contributes to improvement of the yield. If medical needles are manufactured by cutting this wire rod into a plurality of pieces, needles having a stable tensile strength can be obtained.

REFERENCE SIGNS LIST

A. Outer periphery of rhenium-tungsten wire rod
B. Surface mixture layer
C. Rhenium-tungsten wire rod body
1. Center of radial cross-section
2, 3, 4, 5. Concentric circle in radial cross-section
X, Y. X-axis and Y-axis of radial cross-section While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A rhenium-tungsten wire rod which is a wire rod made of a tungsten alloy containing rhenium, the rhenium-tungsten wire rod having a rhenium content of less than 30 wt % in a unit area at each of 17 points in each of two radial cross-sections of the rhenium-tungsten wire rod, where the unit area is a circle area having 1 μm in diameter, the 17 points comprising intersections (16 points) of four equally spaced concentric circles with two axes and a center (1 point) in said each of two radial cross-sections, the two axes being parallel to a diameter of said each of two radial cross-sections and intersecting each other,
wherein the rhenium content has a coefficient of variation of 0.10 or less in semi-quantitative analysis using an electron probe microanalyzer EPMA.

2. The rhenium-tungsten wire rod according to claim 1, wherein the rhenium content is 1 wt % or more and less than 30 wt %.

3. The rhenium-tungsten wire rod according to claim 1, wherein the rhenium content is 2 wt % to 28 wt %.

4. The rhenium-tungsten wire rod according to claim 1, wherein the tungsten alloy contains 30 wtppm to 90 wtppm of potassium (K).

5. The rhenium-tungsten wire rod according to claim 1, wherein the rhenium-tungsten wire rod has a diameter of 0.1 mm to 5.0 mm.

6. The rhenium-tungsten wire rod according to claim 5, wherein the rhenium-tungsten wire rod has a standard deviation of tensile strength of 35 N/mm² or less.

7. A thermocouple which comprises the rhenium-tungsten wire rod according to claim 1.

\* \* \* \* \*